US009147586B2

(12) United States Patent
Lu et al.

(10) Patent No.: US 9,147,586 B2
(45) Date of Patent: Sep. 29, 2015

(54) SEMICONDUCTOR PACKAGE WITH CONNECTING PLATE FOR INTERNAL CONNECTION

(71) Applicant: Alpha and Omega Semiconductor Incorporated, Sunnyvale, CA (US)

(72) Inventors: Jun Lu, San Jose, CA (US); Kai Liu, Mountain View, CA (US); Yan Xun Xue, Los Gatos, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 25 days.

(21) Appl. No.: 14/083,452

(22) Filed: Nov. 19, 2013

(65) Prior Publication Data

US 2014/0070386 A1 Mar. 13, 2014

Related U.S. Application Data

(62) Division of application No. 12/722,528, filed on Mar. 12, 2010, now Pat. No. 8,722,466.

(51) Int. Cl.

| | |
|---|---|
| ***H01L 23/495*** | (2006.01) |
| ***H01L 23/34*** | (2006.01) |
| ***H01L 23/498*** | (2006.01) |
| ***H01L 21/56*** | (2006.01) |
| ***H01L 23/00*** | (2006.01) |
| ***H01L 25/07*** | (2006.01) |
| *H01L 23/31* | (2006.01) |

(52) U.S. Cl.

CPC ........ *H01L 21/565* (2013.01); *H01L 23/49517* (2013.01); *H01L 23/49524* (2013.01); *H01L 23/49551* (2013.01); *H01L 23/49562* (2013.01); *H01L 23/49575* (2013.01); *H01L 24/34* (2013.01); *H01L 25/07* (2013.01); *H01L 23/3107* (2013.01); *H01L 24/48* (2013.01); *H01L 2224/32245* (2013.01); *H01L 2224/37011* (2013.01); *H01L 2224/40137* (2013.01); *H01L 2224/48091* (2013.01); *H01L 2224/48247* (2013.01); *H01L 2224/73263* (2013.01); *H01L 2224/73265* (2013.01); *H01L 2924/014* (2013.01); *H01L 2924/01005* (2013.01); *H01L 2924/01006* (2013.01); *H01L 2924/01029* (2013.01); *H01L 2924/01033* (2013.01); *H01L 2924/01075* (2013.01); *H01L 2924/01082* (2013.01); *H01L 2924/1306* (2013.01); *H01L 2924/13091* (2013.01)

(58) Field of Classification Search

CPC ........... H01L 2224/48247; H01L 2224/73265; H01L 2224/48465; H01L 23/49541

USPC ........... 257/666, 676, 723, E23.043, E23.061

See application file for complete search history.

(56) References Cited

U.S. PATENT DOCUMENTS

| | | | | |
|---|---|---|---|---|
| 7,776,658 B2 * | 8/2010 | Liu et al. | ........................ | 257/666 |
| 7,847,375 B2 * | 12/2010 | Mahler et al. | ................. | 257/666 |
| 2004/0082109 A1 * | 4/2004 | Tanaka | .......................... | 438/112 |

*Primary Examiner* — Cuong Q Nguyen

(74) *Attorney, Agent, or Firm* — Chein-Hwa S. Tsao

(57) ABSTRACT

A semiconductor package with connecting plate for internal connection comprise: a plurality of chips each having a plurality of contact areas on a top surface; one or more connecting plates having a plurality of electrically isolated connecting plate portions each connecting a contact area of the semiconductor chips. The method of making the semiconductor package includes the steps of connecting one or more connecting plates to a plurality of semiconductor chips, applying a molding material to encapsulate the chips and the connecting plates, separating a plurality of connecting plate portions of the connecting plates by shallow cutting through or by grinding.

19 Claims, 17 Drawing Sheets

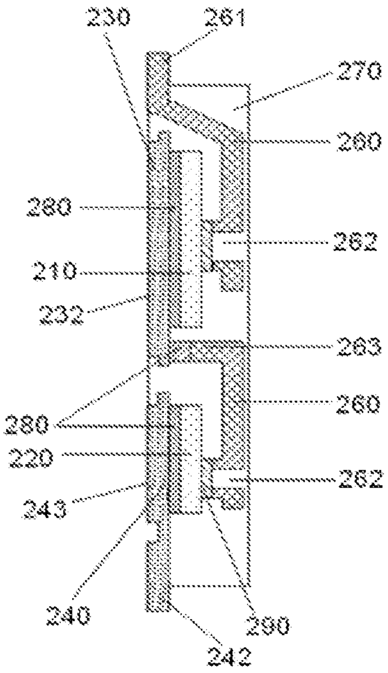
Fig. 8B
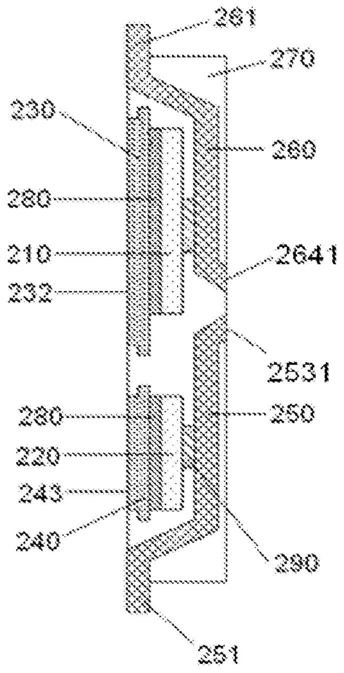
Fig. 8C
Step 1: Provide a lead frame
↓
Step 2: Mount a plurality of chips onto the lead frame
↓
Step 3: Provide a plurality of connecting plates, align and connect the chips to the connecting plates
↓
Step 4: Encapsulate the lead frame, the chips and the connecting paltes
↓
Step 5: Grind a top layer of encapsulation to separate the connecting plate portions
Fig. 9

Step 1: Provide a lead frame
↓
Step 2: Mount a plurality of chips onto the lead frame
↓
Step 3: Provide a connecting plate, align and connect the chips to the connecting plate
↓
Step 4: Encapsulate the lead frame, the chips and the connecting palte
↓
Step 5: Grind a top layer of encapsulation to separate the connecting plate portions
Fig. 19
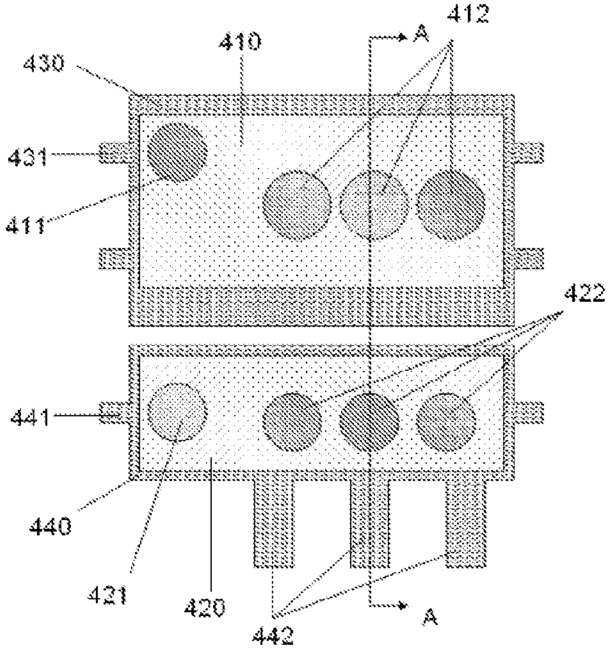
Fig. 20A
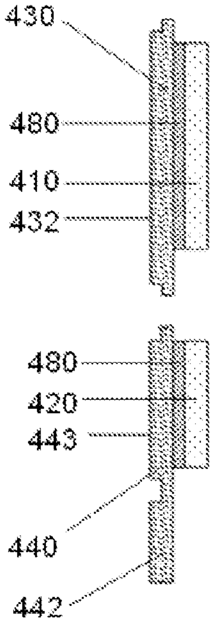
Fig. 20B

SEMICONDUCTOR PACKAGE WITH CONNECTING PLATE FOR INTERNAL CONNECTION

CROSS-REFERENCE TO RELATED APPLICATIONS

This Patent Application is a Divisional Application of a co-pending application Ser. No. 12/722,528 filed on Mar. 12, 2010. Thus, this application claims the Priority Date of the co-pending application Ser. No. 12/722,528. Also, the Disclosures made in the co-pending application Ser. No. 12/722,528 are hereby incorporated by reference.

TECHNICAL FIELD

This invention relates to a semiconductor package structure and packaging fabrication method, especially a semiconductor package and packaging method using connecting plate for internal connection.

BACKGROUND TECHNOLOGY

In response to the need to miniaturize electronic products, multi-chip semiconductor package that encloses multiple chips in a single package has become a trend.

As disclosed in Chinese Patent Publication No. CN201063342Y, a multi-chip packaging structure includes: a first lead frame comprising a first chip carrier, a first internal pin and a second external pin; a second lead frame comprising a second chip carrier and a second internal pin; the second lead frame is positioned above or below the first lead frame, and the first lead frame is electrically connected to the second lead frame via a connector; the first chip is fixed on the first chip carrier, a bonding pad on the first chip is electrically connected to the first internal pin via a lead wire; the second chip is fixed on the second chip carrier, and a bonding pad on the second chip is electrically connected to the second internal pin via a lead wire; and a plastic molding that encapsulates the first chip carrier, the first internal pin, the first chip, the second lead frame and the second chip.

In existing technology, there is also such packaging structure as shown in FIG. 1, wherein the chip 2 is connected with the pin arrays 3 and 4 using the lead wire 1, then at the position indicated by the arrow in the figure, the pin arrays 3 and 4 may be cut into multiple arrays of pins 31, 32 and 41, 41, thus setting multiple pins for the semiconductor package for easy connection with the external circuit.

The above existing technology for chip packaging uses the lead wire for connection between the chip and the lead frame, but the multiple chips connected by the lead wire are usually apt to dislocated in the process of bonding and soldering re-flow, resulting in short circuit among lead wires and affecting the circuit performance.

SUMMARY OF THE INVENTION

The purpose of this invention is to provide a semiconductor package and fabrication method using a connecting plate for internal connection, wherein the connecting plate is used for fixing and connecting a plurality of chips inside the semiconductor package, so that the plurality of chips may be securely positioned and in the assembly process. The connecting plate is divided into electrically isolated portions thus simplifying the process and reducing the assembly cost.

The semiconductor package of this invention comprises a plurality of semiconductor chips each having a plurality of electrode contact areas disposed on a top surface and a first connecting plate comprising a plurality of connecting plate tie bar upward regions separating the connecting plate into a plurality of connecting plate portions; whereas each of the plurality of connecting plate portions electrically connecting to a contact area of the plurality of electrode contact areas; whereas a conductive section of each of the plurality of connecting plate tie bar upward regions is removed such that each of the plurality of connecting plate portions is electrically isolated from the others. In one embodiment, the first connecting plate may comprise a first connecting plate portion and a second connecting plate portion separated by a plurality of tie bar upward regions, the first connecting plate portion electrically connects to a first electrode contact area on a first semiconductor chip and the second connecting plate portion electrically connects to a second electrode contact area on the first semiconductor chip; In another embodiment, the second connecting plate portion electrically connects to a first electrode contact area on a second semiconductor chip.

The semiconductor package may further comprise a lead frame with a plurality of die pads for the plurality of semiconductor chips to mount thereon; in one embodiment the lead frame comprises a first die pad for mounting a first semiconductor chip thereon and a second die pad for mounting a second semiconductor chip thereon, in another embodiment the first connecting plate further comprises a downward portion connecting to the first die pad. In yet another embodiment, the first semiconductor chip comprises a high-side MOSFET and the second semiconductor chip comprises a low-side MOSFET.

The semiconductor package may further comprises a molding material substantially encapsulates the lead frame, the plurality of chips and the first connecting plate. In one embodiment the molding material has a top surface with a shallow trench cutting through sections of the tie bar upward regions electrically isolating the first and second connecting plate portions. In another embodiment the molding material has a top surface with end cross sections of the remaining tie bar upward regions exposed and flushed with a top surface of the molding material.

The semiconductor package may further comprises a second connecting plate with a first connecting plate portion and a second connecting plate portion separated by a connecting plate tie bar upward region. A conductive section of the tie bar upward region is removed such that the first connecting plate portion is electrically isolated from the second connecting plate portion.

A process of making the above semiconductor package may comprise:

a. providing a plurality of semiconductor chips each having a plurality of electrode contact areas disposed on a top surface;
b. providing a first connecting plate comprising a plurality of connecting plate portions separated by a plurality of connecting plate tie bar upward regions; and
c. electrically connecting each of the plurality of connecting plate portions to a contact area of the plurality of electrode contact areas.

The process of packaging may further comprise applying a molding compound to substantially encapsulate the plurality of semiconductor chips and the first connecting plate. In one embodiment, a shallow cutting through process is implemented to remove a conductive section of at least one of the plurality of tie bar upward regions by cutting through a portion of the molding compound and the conductive section of at least one of plurality of tie bar upward regions; in another embodiment a conductive section of each of the plurality of tie bar upward regions is removed by cutting through a portion of the molding compound and the conductive section of each of the plurality of tie bar upward regions for electrically isolating each connecting plate portion from the other; in another embodiment, the process may further comprise a step to refill the cut through portion with a dielectric material such as the molding compound material to substantially flatten a top surface. In a alternative embodiment the process may further comprising a grinding process to remove a surface portion of the molding compound and portions of the plurality of tie bar upward regions to the extend a conductive section of each of the plurality of tie bar upward regions is removed such that each of the plurality of tie bar upward regions is electrically isolating from the other, followed with an optional step by applying a dielectric layer on top of the grinded surface.

The process may further comprise mounting the plurality of semiconductor chips onto a lead frame. In one embodiment the process comprise mounting a first MOSFET chip mounting onto a first die pad of the lead frame; in another embodiment the process further comprises mounting a second MOSFET chip onto a second die pad of the lead frame. In another embodiment the process further comprises connecting a downward portion of the first connecting plate to the first die pad.

The process may further comprise providing a second connecting plate having a tie bar upward region for connecting the first MOSFET and the second MOSFET.

BRIEF DESCRIPTION OF FIGURES

FIG. 8B shows the structure of the cross section along the line A-A in FIG. 8A.

FIG. 8C shows the structure of the cross section along the line B-B in FIG. 8A.

FIG. 9 shows the fabrication flow of the semiconductor package in Implementation Example II, wherein two chips may be connected via two connecting plates.

FIG. 19 shows the fabrication flow of the semiconductor package in Implementation Example IV, wherein two chips may be connected via one connecting plate.

FIG. 20A shows the structure for attaching the chip onto the lead frame in Implementation Example IV.

FIG. 20B shows the structure of the cross section along the line A-A in FIG. 20A.

DETAILED DESCRIPTION

Reference is directed to the attached figures for better understanding of the implementation examples of this invention. However, it is understood that the attached figures are only for description and elaboration, but not for limiting the scope of this invention.

Figure 1:
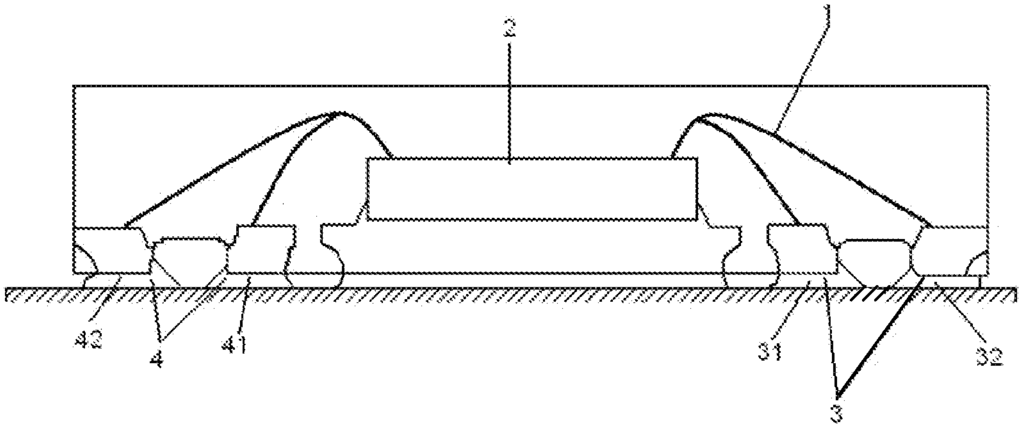
FIG. 1 shows the structure of a semiconductor package in existing technology.
Figure 2A:
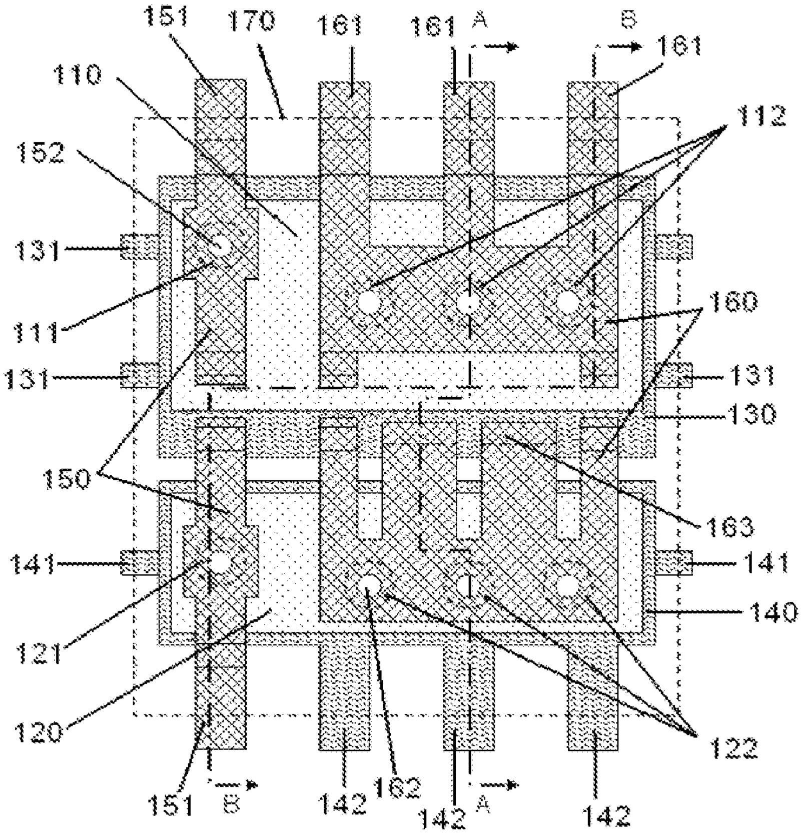
FIG. 2A shows a structure of the semiconductor package in Implementation Example I, wherein two chips are fixed and connected using two connecting slices and the connecting slices are separated after cutting on the top layer.
Figure 2B:
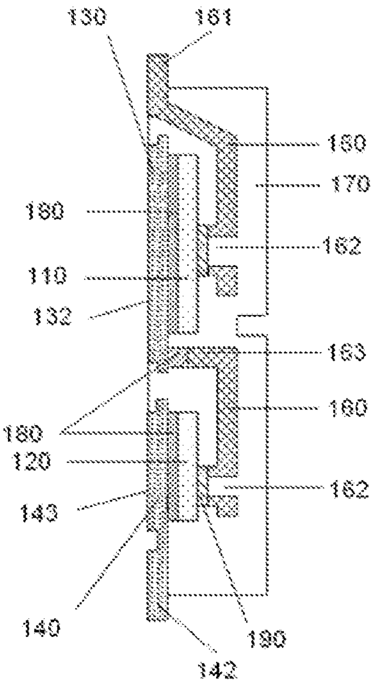
FIG. 2B shows the structure of the cross section along the line A-A in FIG. 2A.
Figure 2C:
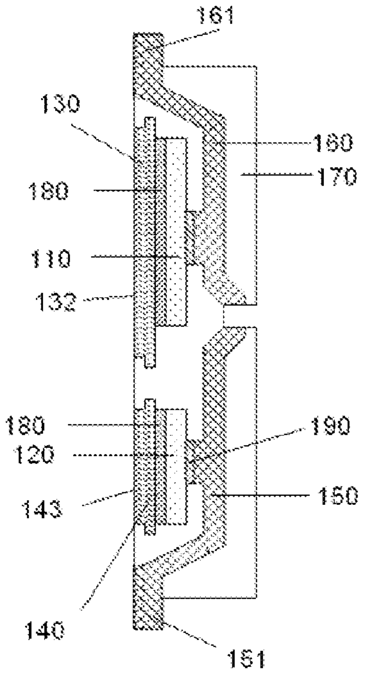
FIG. 2C shows the structure of the cross section along the line B-B in FIG. 2A.

IMPLEMENTATION EXAMPLE I the semiconductor package using connecting plate for internal connection, as shown in FIG. 2A, FIG. 2B and FIG. 2C, comprises two chips, a lead frame, a plurality of connecting plates and a plastic package 170 encapsulating all the above components; the two chips may be respectively a low-side metal-oxide-semiconductor field-effect transistor (LS MOSFET) 110 and a high-side metal-oxide-semiconductor field-effect transistor (HS MOSFET) 120. Top contact zones of LS MOSFET 110 may be respectively a gate contact zone 111 and a source contact zone 112, while bottom contact zone may be a drain contact zone (not shown). Top contact zones of HS MOSFET 120 may be respectively a gate contact zone 121 and a source contact zone 122, while bottom contact zone may be a drain contact zone (not shown). The lead frame may include a first die pad 130 and a second die pad 140, onto which the LS MOSFET 110 and the HS MOSFET 120 are respectively mounted through adhesive 180. The bottom drain contact zones of LS MOSFET 110 and HS MOSFET 120 are electrically connected with each die pad of the lead frame. An exposed die pad bottom 132 serves as the drain contact electrode of package for connecting LS MOSFET 110 with external circuit and facilitate heat dissipation of the power semiconductor. A plurality of tie bars 131 are used for connection among various units of the lead frame (only one unit is shown). On the lead frame's second die pad 140, there may be a plurality of tie bars 141, and pins 142 connecting to the die pad 140 with an exposed bottom 143, in which the lead frame's pins 142 are used for connection between the package and external circuit. Multiple connecting plates include a first connecting plate 150 and a second connecting plate 160, and preferably the connecting plates are made of copper. The first connecting plate 150 comprises a tie bar upward region 153 dividing the first connecting plate 150 into a first section **150*a* and a second section 150*b*. A section of conductive tie bar upward region 153 is removed to provide electrical isolation between the first section 150*a* and the second section 150*b*, which respectively connects the gate contact zone 111 of LS MOSFET 110 and the gate contact zone 121 of HS MOSFET 120 through solder 190, thus fixing the position of LS MOSFET 110 and HS MOSFET 120. On the first connecting plate 150, there may be hollow cylindrical columns 152 at positions corresponding to the gate contact zones 111 and 121 of LS MOSFET 110 and HS MOSFET 120. End portions 151 of the first connecting plate 150 may extend outside a molding plastic package 170 for use as package pins to connect with external circuit. Similarly, the second connecting plate 160 comprises one or more tie bar upward regions 164 dividing the second connecting plate 160 into a first section 160*a* and a second section 160*b*. A section of each conductive tie bar upward regions 164 is removed to provide electrical isolation between the first section 160*a* and the second section 160*b*, which respectively connects the source contact zone 112 of LS MOSFET 110 and the source contact zone 122 of HS MOSFET 120 through solder 190, thus fixing the position of LS MOSFET 110 and HS MOSFET 120. On the second connecting plate 160, there are hollow cylindrical columns 162 at positions corresponding to the source contact zones 112 and 122 of LS MOSFET 110 and HS MOSFET 120, as shown in FIG. 2B. FIG. 2B shows the cross section along the line A-A in FIG. 2A. Since the line A-A just runs through the column 162, FIG. 2B shows the column 162 very clearly. When the plastic material 170 is applied for encapsulation, the columns 152 and 162 will be filled up, thus enabling the plastic package to encapsulate the various components inside the package more steadily. One or more end portions 161 of the second connecting plate 160 may extend outside a molding plastic package 170 for use as package pins to connect with external circuit. Besides, the second connecting plate 160 has a downward portion 163 connecting to the first die pad 130 for connection of the top source contact zone of HS MOSFET 120 and the bottom drain contact zone of LS MOSFET 110, thus connecting HS MOSFET 120 and LS MOSFET 110**.

Figure 3A:
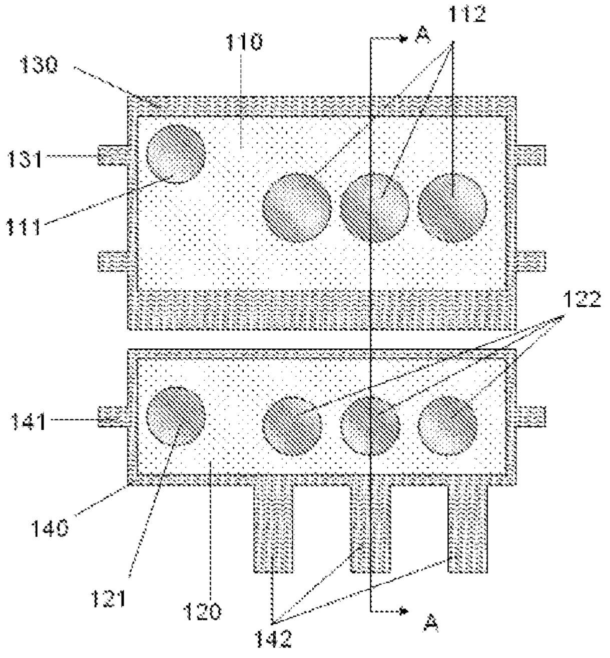
FIG. 3A shows the structure for attaching the chips onto the lead frame in Implementation Example I.
Figure 3B:
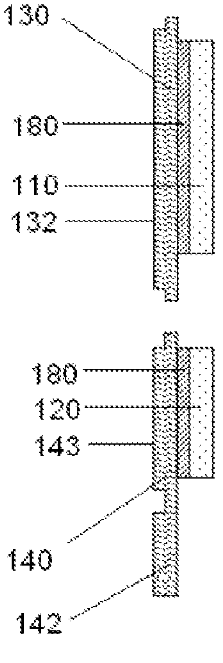
FIG. 3B shows the structure of the cross section along the line A-A in FIG. 3A.
Figure 4A:
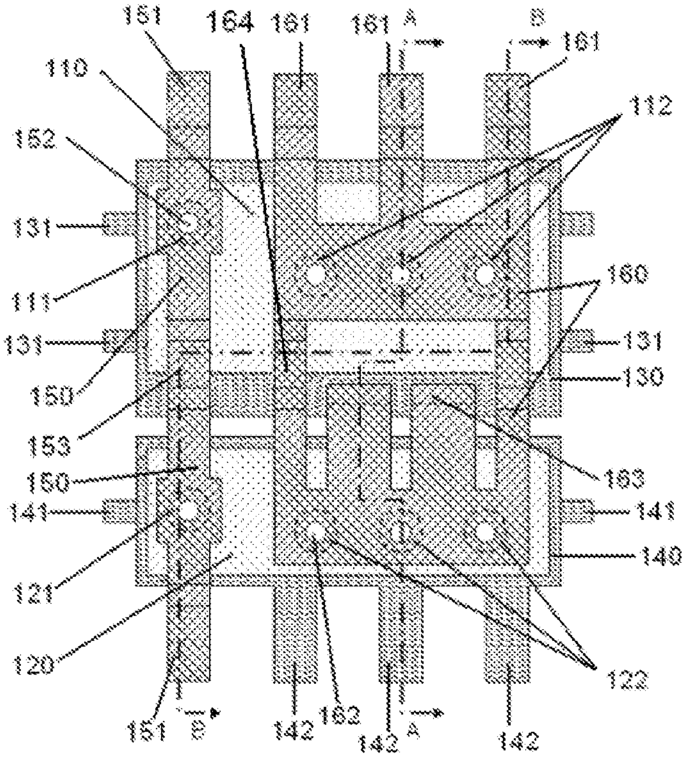
FIG. 4A shows the structure of connecting the top contact zones of two chips with two connecting plates in Implementation Example I.
Figure 4B:
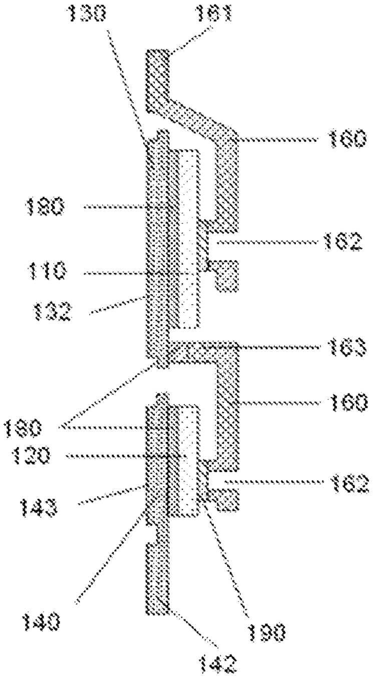
FIG. 4B shows the structure of the cross section along the line A-A in FIG. 4A.
Figure 4C:
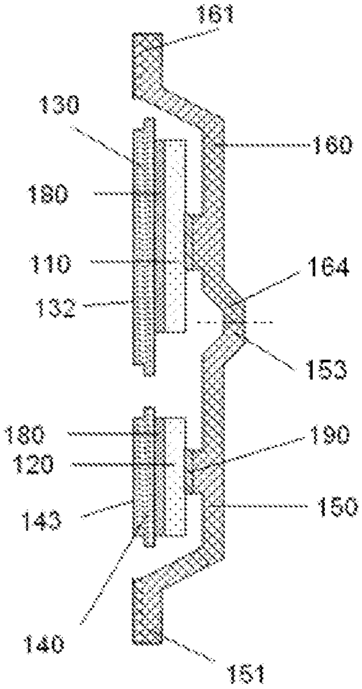
FIG. 4C shows the structure of the cross section along the line B-B in FIG. 4A.
Figure 7:
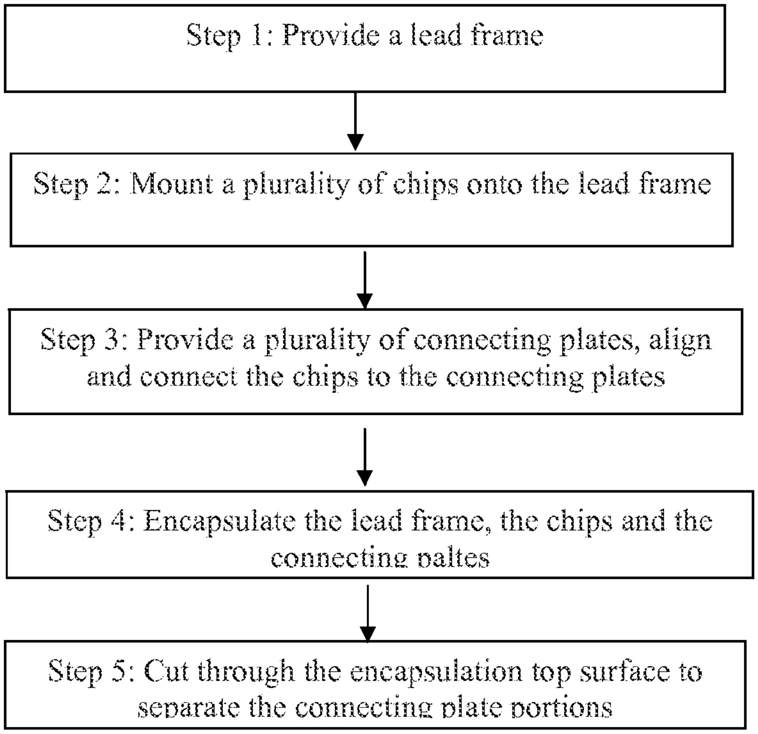
FIG. 7 shows the fabrication flow of the semiconductor package in Implementation Example I, wherein two chips are connected via two connecting slices of the semiconductor.

The procedure of semiconductor packaging method using connecting plate for internal connection, as shown in FIG. 7, includes the following steps: as shown in FIG. 3A and FIG. 3B, firstly provide a lead frame that comprises the first die pad 130 and the second die pad 140; next, provide two chips, which may be respectively LS MOSFET 110 and HS MOSFET 120. The top contact zones of LS MOSFET 110 may be respectively the gate contact zone 111 and the source contact zone 112, while the bottom contact zone is drain contact zone (not shown). The top contact zones of HS MOSFET 120 may be respectively the gate contact zone 121 and the source contact zone 122, while the bottom contact zone is drain contact zone (not shown). LS MOSFET 110 and HS MOSFET 120 may be set on the lead frame's first die pad 130 and the lead frame's second die pad 140 respectively, using the adhesive 180, while the bottom drain contact zones of LS MOSFET 110 and HS MOSFET 120 are electrically connected with the corresponding die pads; next, as shown in FIG. 4A, FIG. 4B and FIG. 4C, provide two connecting plates, i.e. the first connecting plate 150 and the second connecting plate 160, arranging the top contact zones of LS MOSFET 110 and HS MOSFET 120 in alignment with each other. The first connecting plate 150 connects the gate contact zone 111 of LS MOSFET 110 and the gate contact zone 121 of HS MOSFET 120 through the solder 190. The first connecting plate 150 has the tie bar upward region 153 at a position between where the gate contact zone of LS MOSFET 110 and that of HS MOSFET 120 maybe connected. The connecting plate tie bar upward region 153 is in vertical direction on the chip surface and higher than the chip surface. Similarly, the second connecting plate 160 connects the source contact zone 112 of LS MOSFET 110 and the source contact zone 122 of HS MOSFET 120 through the solder 190. The second connecting plate 160 has the tie bar upward region 164 at a position between where the source contact zone of LS MOSFET 110 and that of HS MOSFET 120 maybe connected. The connecting plate tie bar upward region

Figure 5A:
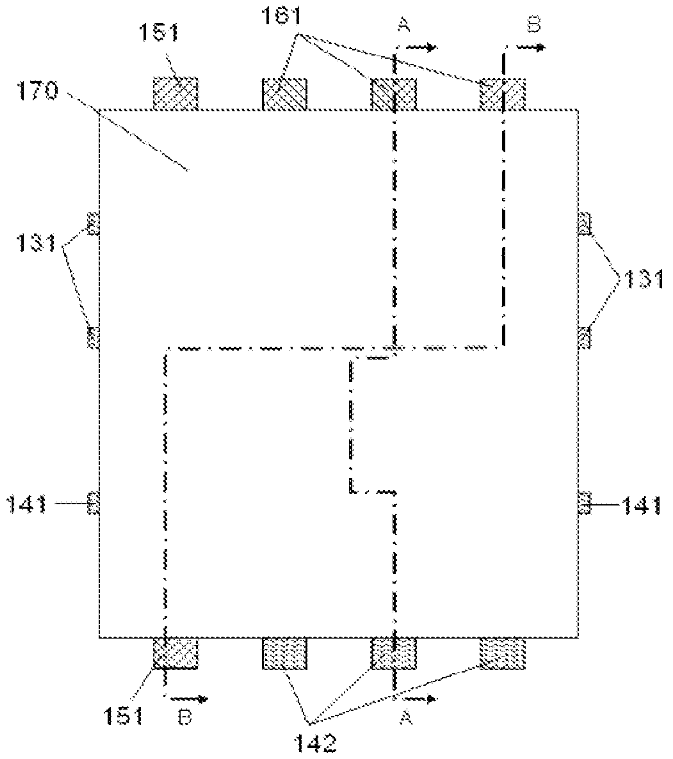
FIG. 5A shows the external packaging structure for encapsulating the semiconductor package using plastic package in Implementation Example I.
Figure 5B:
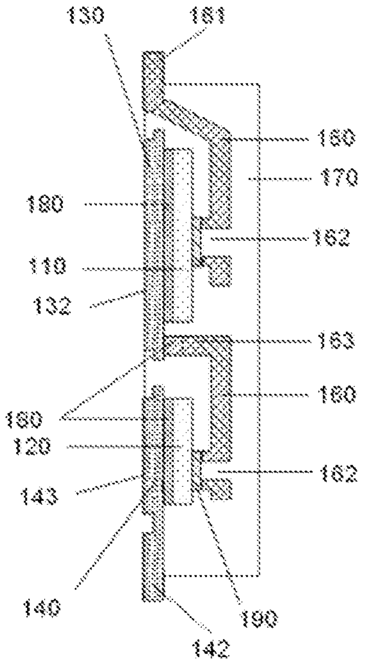
FIG. 5B shows the internal structure of the package along the line A-A in FIG. 5A.
Figure 5C:
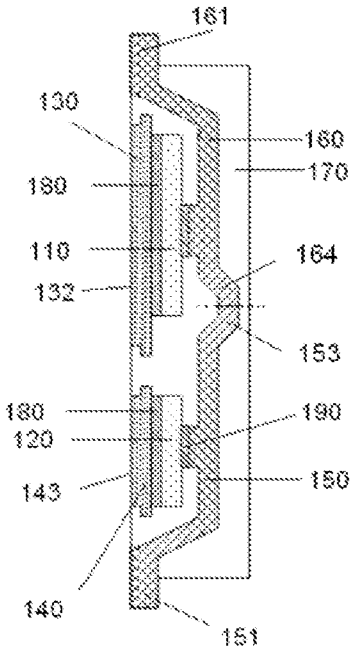
FIG. 5C shows the internal structure of the package along the line B-B in FIG. 5A.
Figure 6A:
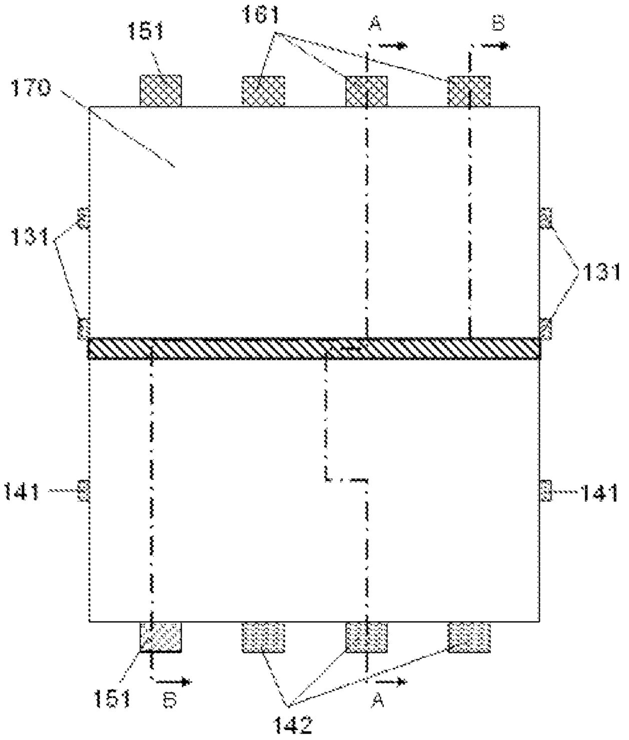
FIG. 6A shows the structure for cutting on the top layer of the plastic package in Implementation Example I.
Figure 6B:
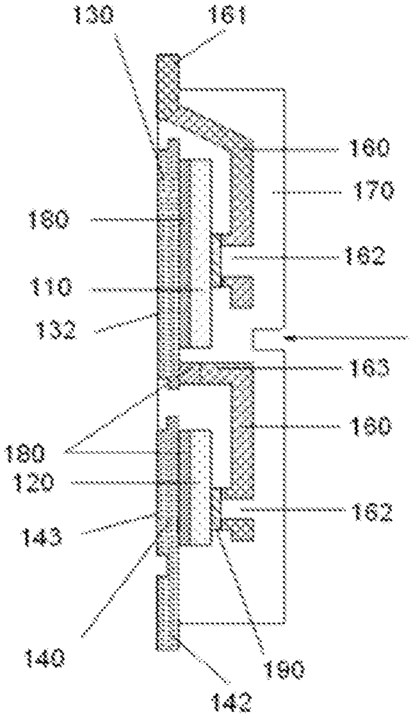
FIG. 6B shows the internal structure of the cut plastic package along the line A-A in FIG. 6A.
Figure 6C:
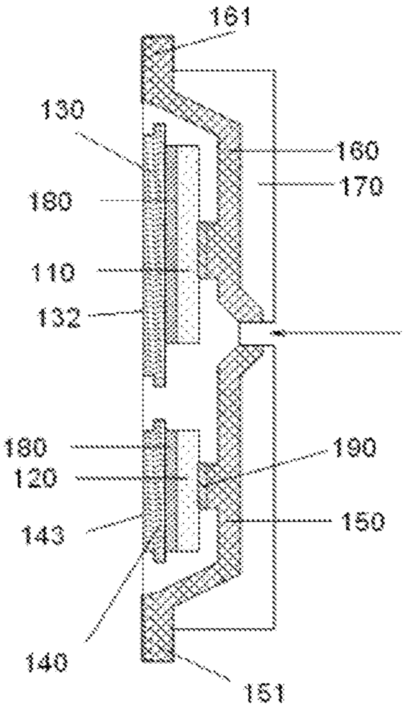
FIG. 6C shows the internal structure of the cut plastic package along the line B-B in FIG. 6A.

164 is in vertical direction on the chip surface and higher than the chip surface. In FIG. 4C, which shows the cross section along the line B-B in FIG. 4A, the complete tie bar upward region structure comprises the connecting plate tie bar upward region 153 and the connecting plate tie bar upward region 164 preferably located on a same plan and aligned in one or two lines. Besides, the second connecting plate 160 has a downward portion 163 connecting to the first die pad 130 for connection of the top source contact zone of HS MOSFET 120 and the bottom drain contact zone of LS MOSFET 110, therefore the positions of LS MOSFET 110 and HS MOSFET 120 are secured by the first connecting plate 150 and the second connecting plate 160. The first connecting plate 150 and the second connecting plate 160 respectively have the columns 152 and the columns 162 at positions in contact with the chips. The end portions 151 of the first connecting plate 150 and the end portions 161 of the second connecting plate 160 may be used as the package pins to connect with the external circuit; then, as shown in FIG. 5A, FIG. 5B and FIG. 5C, provide a molding material 170 to fill up the column 152 and the column 162 and substantially encapsulate the lead frames, chips and connecting plates except the end portions 151 and 161; finally, as shown in FIG. 6A, FIG. 6B and FIG. 6C, on the top of the plastic package 170 between LS MOSFET 150 and MOSFET 160, carry out a shallow cutting in alignment with the tie bar upward region 153 of the first connecting plate 150 and the tie bar upward regions 164 of the second connecting plate 160. Since the connecting plate tie bar upward regions 153 and 164 are set on a straight line, carry out shallow cutting downward in alignment with the shade area in FIG. 6A or in the location as indicated by the arrows in FIGS. 6B and 6C will cut off sections of the tie bar upward region 153 of the first connecting plate 150 and the tie bar upward regions 164 of the second connecting plate 160, dividing the first connecting plate 150 and the second connecting plate 160 respectively into two connecting portions insulated against each other. In this packaging process, multiple chips may be fixed and connected using a plurality of connecting plates, and then the connecting plates are divided by shallow cutting after plastic packaging, thus preventing dislocation between the chips and the lead frames and the connecting plates. The cutting process will leave a trench on top of the package. Alternatively a dielectric material such as the molding compound can be used to refill the trench resulting in a substantial planar top surface.

Figure 8A:
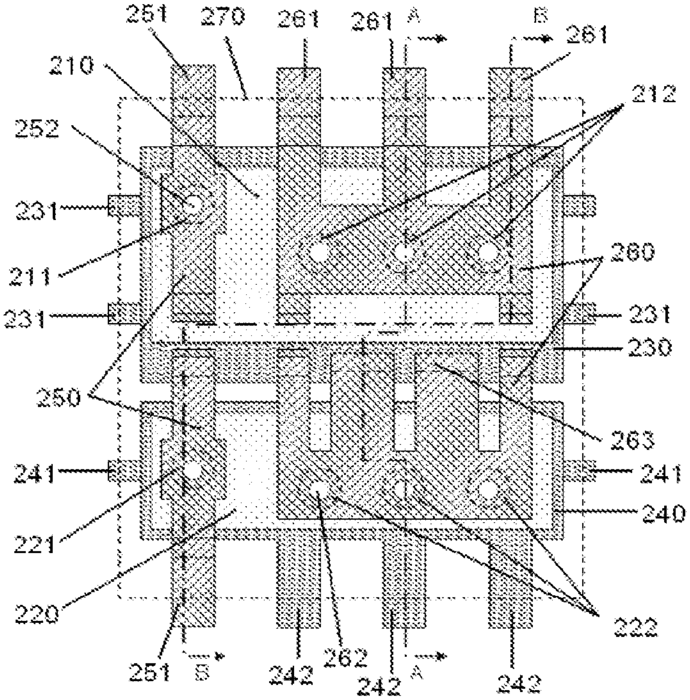
FIG. 8A shows the structure of the semiconductor package in Implementation Example II, wherein two chips are fixed and connected using two connecting plates and the connecting plates may be separated after grinding on the top layer.

IMPLEMENTATION EXAMPLE II the semiconductor package using connecting plate for internal connection, as shown in FIG. 8A, FIG. 8B and FIG. 8C, comprises two chips, a lead frame, multiple connecting plates and a plastic package 270 encapsulating all the above components; the two chips may be respectively low-side metal-oxide-semiconductor field-effect transistor (LS MOSFET) 210 and high-side metal-oxide-semiconductor field-effect transistor (HS MOSFET) 220. The top contact zones of LS MOSFET 210 may be respectively the gate contact zone 211 and the source contact zone 212, while the bottom contact zone may be drain contact zone (not shown). The top contact zones of HS MOSFET 220 may be respectively the gate contact zone 221 and the source contact zone 222, while the bottom contact zone may be drain contact zone (not shown). The lead frame includes a first die pad 230 and a second die pad 240, onto which LS MOSFET 210 and HS MOSFET 220 may be respectively set through the adhesive 280. The bottom drain contact zones of LS MOSFET 210 and HS MOSFET 220 may be electrically connected with each die pad of the lead frame. An exposed die pad bottom 232 serves as the drain contact pad for connecting LS MOSFET 210 with the external circuit and facilitate heat dissipation of the power semiconductor. A plurality of tie bars 231 are used for connection among the various die pads of the neighboring lead frame units (only one unit shown). On the lead frame's second die pad 240, there may be a plurality of tie bars 241, and pins 242 connecting to the die pad 240 with an exposed bottom 243, in which the lead frame's pins 242 are used for connection between the package and the external circuit. Multiple connecting plates include the first connecting plate 250 and the second connecting plate 260, and preferably the connecting plates are made of copper. The first connecting plate 250 comprises a tie bar upward region 253 dividing the first connecting plate 250 into a first section 250*a* and a second section 250*b*. A section of conductive tie bar upward region 253 is removed to provide electrical isolation between the first section 250*a* and the second section 250*b*, which respectively connects the gate contact zone 211 of LS MOSFET 210 and the gate contact zone 221 of HS MOSFET 220 through the solder 290, thus fixing the position of LS MOSFET 210 and HS MOSFET 220. On the first connecting plate 250, there are the hollow cylindrical columns 252 at positions corresponding to the gate contact zones 211 and 221 of LS MOSFET 210 and HS MOSFET 220. End portions 251 of the first connecting plate 250 may extend outside a molding plastic package for use as the package pins to connect with the external circuit. Similarly, the second connecting plate 260 comprises a first section 260*a* and a second section 260*b* divided by one or more tie bar upward regions 264 of the second connecting plate 260. A conductive section of each tie bar upward regions 264 is removed to provide electrical isolation between the first section 260*a* and the second section 260*b*, which respectively connects the source contact zone 212 of LS MOSFET 210 and the source contact zone 222 of HS MOSFET 220 through the solder 290, thus fixing the position of LS MOSFET 210 and HS MOSFET 220. On the second connecting plate 260, there are hollow cylindrical columns 262 at positions corresponding to the source contact zones 212 and 222 of LS MOSFET 210 and HS MOSFET 220, as shown in FIG. 8B. FIG. 8B shows the cross section along the line A-A in FIG. 8A. Since the line A-A just runs through the column 262, FIG. 8B shows the column 262 very clearly. When the plastic package 270 is used for encapsulation, the columns 252 and 262 will be filled up, thus enabling the plastic package to encapsulate the various components inside the package more steadily. As shown in FIG. 8C, end cross sections 2531 of the discontinue portions of first connecting plate 250 and the cross end sections 2641 of the discontinue portions of second connecting plate 260 expose and flush with the top surface of the plastic package 270. The end sections 2531 and 2641 can serve as the top heat dissipation ports of the power semiconductor, and the end portions 261 of the second connecting plate 260 extending outside a molding plastic package 270 are used as a package pin to connect with the external circuit. Besides, the second connecting plate 260 has a downward portion 263 connecting the first die pad 230 for connection of the top source contact zone of HS MOSFET 220 and the bottom drain contact zone of LS MOSFET 210, thus connecting HS MOSFET 220 and LS MOSFET 210.

Figure 10A:
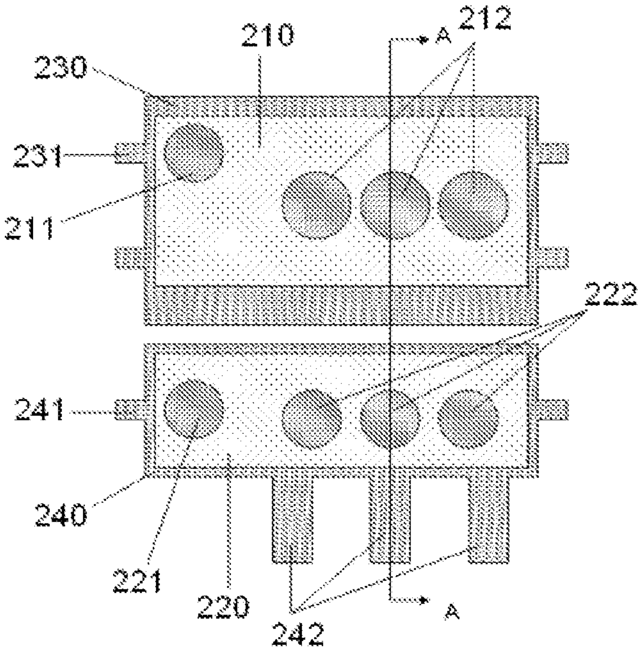
FIG. 10A shows the structure for attaching the chip onto the lead frame in Implementation Example II.
Figure 10B:
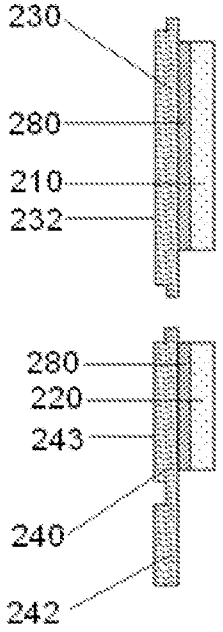
FIG. 10B shows the structure of the cross section along the line A-A in FIG. 10A.
Figure 11A:
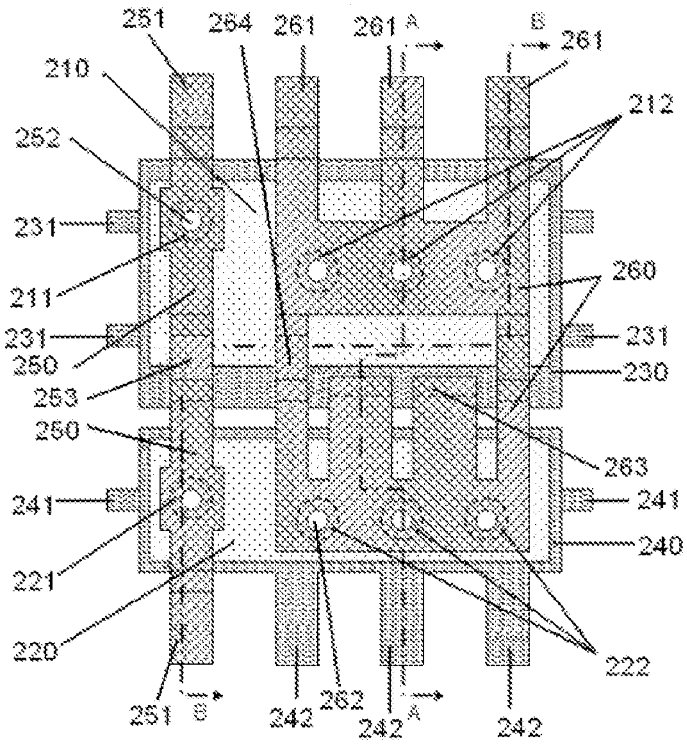
FIG. 11A shows the structure for connecting the top contact zones of two chips with two connecting plates in Implementation Example II.
Figure 11B:
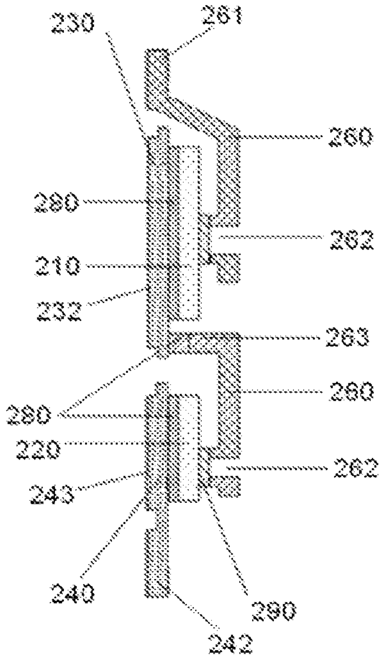
FIG. 11B shows the structure of the cross section along the line A-A in FIG. 11A.
Figure 11C:
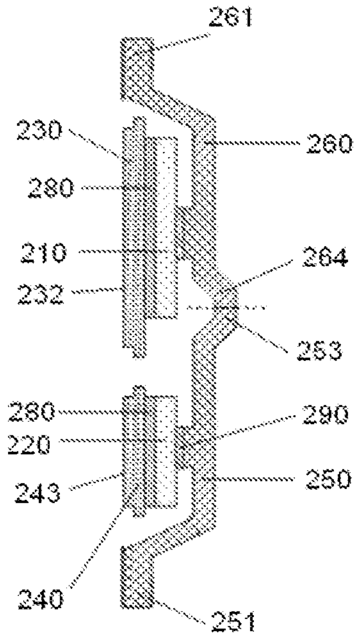
FIG. 11C shows the structure of the cross section along the line B-B in FIG. 11A.
Figure 12:
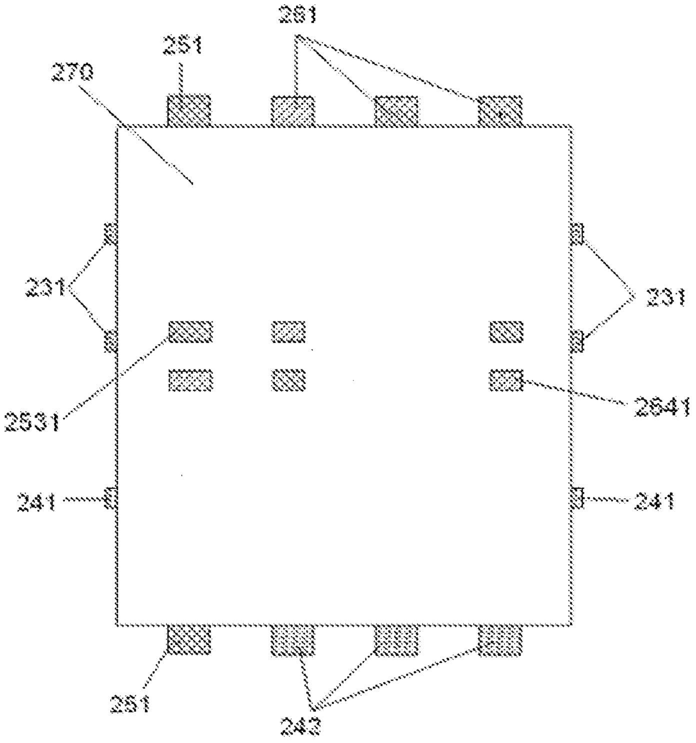
FIG. 12 shows the structure for grinding on the top layer of the plastic package in Implementation Example II.

The procedure of semiconductor packaging method using connecting plate for internal connection, as shown in FIG. 9, includes the following steps: as shown in FIG. 10A and FIG. 10B, firstly provide a lead frame that comprises the lead frame's first die pad 230 and the lead frame's second die pad 240 with lead frame tie bars 231 and 241; next, provide two chips, which may be respectively LS MOSFET 210 and HS MOSFET 220. The top contact zones of LS MOSFET 210 may be respectively the gate contact zone 211 and the source contact zone 212, while the bottom contact zone may be the drain contact zone (not shown). The top contact zones of HS MOSFET 220 may be respectively the gate contact zone 221 and the source contact zone 222, while the bottom contact zone may be drain contact zone (not shown). LS MOSFET 210 and HS MOSFET 220 may be set on the lead frame's first die pad 230 and the lead frame's second die pad 240 respectively, using the adhesive 280, while the bottom drain contact zones of LS MOSFET 210 and HS MOSFET 220 may be electrically connected with the lead frame's corresponding die pads; next, as shown in FIG. 11A, FIG. 11B and FIG. 11C, provide two connecting plates, i.e. the first connecting plate 250 and the second connecting plate 260, arranging the top contact zones of LS MOSFET 210 and HS MOSFET 220 in alignment with each other. The first connecting plate 250 connects the gate contact zone 211 of LS MOSFET 210 and the gate contact zone 221 of HS MOSFET 220 through the welding effect of the solder 290. The first connecting plate 250 has the connecting plate tie bar upward region 253 at a position between where the gate contact zone of LS MOSFET 210 and that of HS MOSFET 220 may be connected. The connecting plate tie bar upward region 253 is in vertical direction on the chip surface and higher than the chip surface. Similarly, the second connecting plate 260 connects the source contact zone 212 of LS MOSFET 210 and the source contact zone 222 of HS MOSFET 220 through the solder 290. The second piece 260 has the connecting plate tie bar upward regions 264 at the positions between where the gate contact zone of LS MOSFET 210 and that of HS MOSFET 220 may be connected. The connecting plate tie bar upward regions 264 are in vertical direction on the chip surface and higher than the chip surface. In FIG. 11C, which shows the cross section along the line B-B in FIG. 11A, the complete tie bar upward regions structure comprises the connecting plate tie bar upward region 253 and the connecting plate tie bar upward regions 264. Besides, the second connecting plate 260 has a downward portion 263 connecting to the first die pad 230 for connection of the top source contact zone of HS MOSFET 220 and the bottom drain contact zone of LS MOSFET 210, therefore the position of LS MOSFET 210 and HS MOSFET 220 is secured by the first connecting plate 250 and the second connecting plate 260. The first connecting plate 250 and the second connecting plate 260 respectively have the column 252 and the column 262 at positions in contact with the chip top. End portions 251 of the first connecting plate 250 and the end portion 261 of the second connecting plate 260 may be extending outside a molding plastic package for used as the package's pins to connect with the external circuit; then, provide a plastic molding material 270 to fill up the column 252 and the column 262 and substantially encapsulate the lead frames, the chips and the connecting plates except end portions 251 and 261; finally, as shown in FIG. 12, grind the top layer of the plastic package 270 to remove the top portion of the molding material and portions of the tie bar upward regions 253 and 264 to the extend that the first and second sections of both the first connecting plate 250 and the second connecting plate 260 are completely disconnected with the cross sections 2531 of the tie bar upward region 253 of the first connecting plate and the cross sections 2641 of the tie bar upward region 264 of the second connecting plate exposed and separated, thus dividing the first connecting plate 250 and the second connecting plate 260 into four connecting plate portions insulated against each other. The above cross sections can be used for heat dissipation of the power semiconductor. In this packaging process, firstly one or more chips may be fixed and connected using the first connecting plate 250 and the second connecting plate 260, then the connecting plates may be divided by grinding the top layer of the plastic package after plastic packaging, thus preventing dislocation between the chips and the lead frames and the connecting plates, and the process is easy to operate. Alternatively, an optional dielectric layer such as a layer of molding compound may be disposed at the top surface to cover up the exposed connecting plate sections.

Figure 13A:
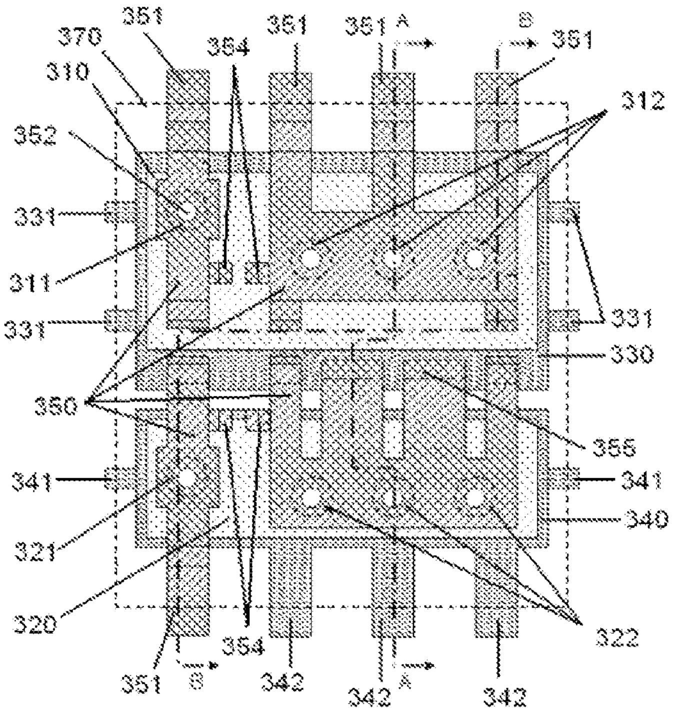
FIG. 13A shows the structure the semiconductor package in Implementation Example III, wherein two chips may be fixed and connected with one connecting plate and the connecting plate is separated after cutting on the top layer.
Figure 13B:
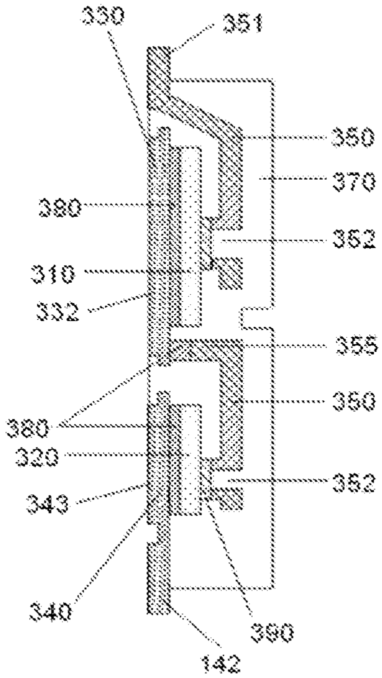
FIG. 13B shows the structure of the cross section along the line A-A in FIG. 13A.
Figure 13C:
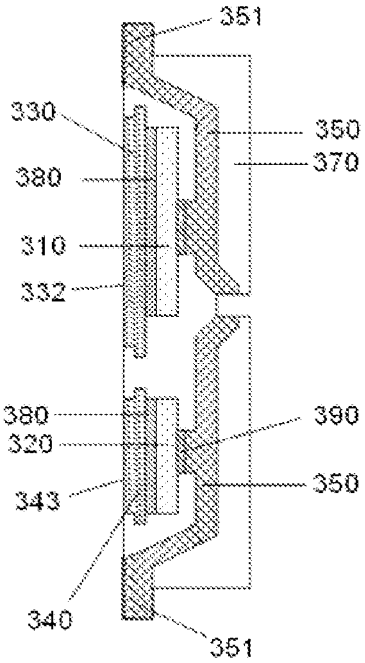
FIG. 13C shows the structure of the cross section along the line B-B in FIG. 13A.

IMPLEMENTATION EXAMPLE III the semiconductor package using connecting plate for internal connection, as shown in FIG. 13A, FIG. 13B and FIG. 13C, comprises two chips, a lead frame, a connecting plate and a plastic package 370 encapsulating all the above components; the two chips may be respectively low-side metal-oxide-semiconductor field-effect transistor (LS MOSFET) 310 and high-side metal-oxide-semiconductor field-effect transistor (HS MOSFET) 320. The top contact zones of LS MOSFET 310 may be respectively the gate contact zone 311 and the source contact zone 312, while the bottom contact zone may be drain contact zone (not shown). The top contact zones of HS MOSFET 320 may be respectively the gate contact zone 321 and the source contact zone 322, while the bottom contact zone may be drain contact zone (not shown). The lead frame includes the first die pad 330 and the second die pad 340, onto which LS MOSFET 310 and HS MOSFET 320 may be respectively set through the adhesive 380. The bottom drain contact zones of LS MOSFET 310 and HS MOSFET 320 may be electrically connected with each die pad of the lead frame. An exposed bottom 332 serves as the drain contact electrode for connecting LS MOSFET 310 with the external circuit and facilitates heat dissipation of the power semiconductor. A plurality of connecting bars 331 are used for connection among the various units of the lead frame (only one unit is shown). On the lead frame's second die pad 340, there may be a plurality of tie bars 341, and pins 342 connecting to the die pad 340 with an exposed bottom 343, in which the lead frame's pins 342 are used for connection between the package and the external circuit. Multiple connecting plate portions may be divided from a connecting plate 350, on which there are multiple connecting plate upward regions 353 and 354 for connecting the various portions of the connecting plate. Sections of conductive tie bar upward regions 353 and 354 are removed to provide electrical isolation between the various portions of the connecting plate each connects respectively the gate contact zone 311 of LS MOSFET 310 and the gate contact zone 321 of HS MOSFET 320, as well as the source contact zone 312 of LS MOSFET 310 and the source contact zone 322 of HS MOSFET 320 through solder 390, thus fixing the position of LS MOSFET 310 and HS MOSFET 320. On the connecting plate 350, there are hollow cylindrical columns 352 at positions corresponding to the gate contact zones 311 and 321 as well as the source contact zones 312 and 322 of LS MOSFET 310 and HS MOSFET 320. End portions 351 of the connecting plate 350 may extend outside a plastic package for use as the package pins to connect with the external circuit, as shown in FIG. 13B. FIG. 13B shows the cross section along the line A-A in FIG. 13A. Since the line A-A just runs through the column 352, FIG. 13B shows the column 352 very clearly. When the plastic molding compound 370 is used for encapsulation, the columns 352 will be filled up, thus enabling the plastic package to encapsulate the various components inside the package more steadily. Besides, the connecting plate 350 has a downward portion 355 connecting to the first die pad 330 for connection of the top source contact zone of HS MOSFET 320 and the bottom drain contact zone of LS MOSFET 310, thus connecting HS MOSFET 320 and LS MOSFET 310.

Figure 14:
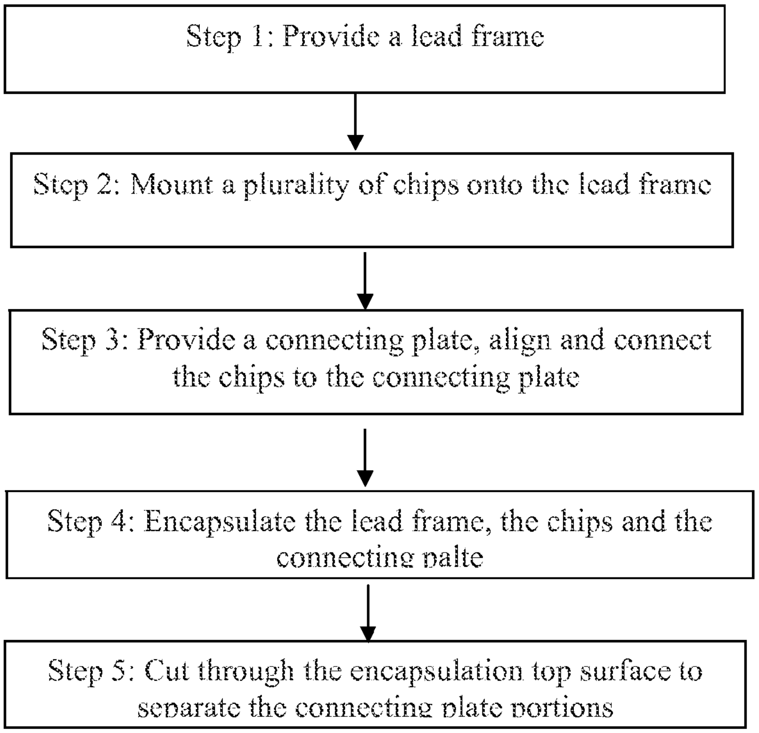
FIG. 14 shows the fabrication flow of the semiconductor package in Implementation Example III, wherein two chips may be connected via one connecting plate.
Figure 15A:
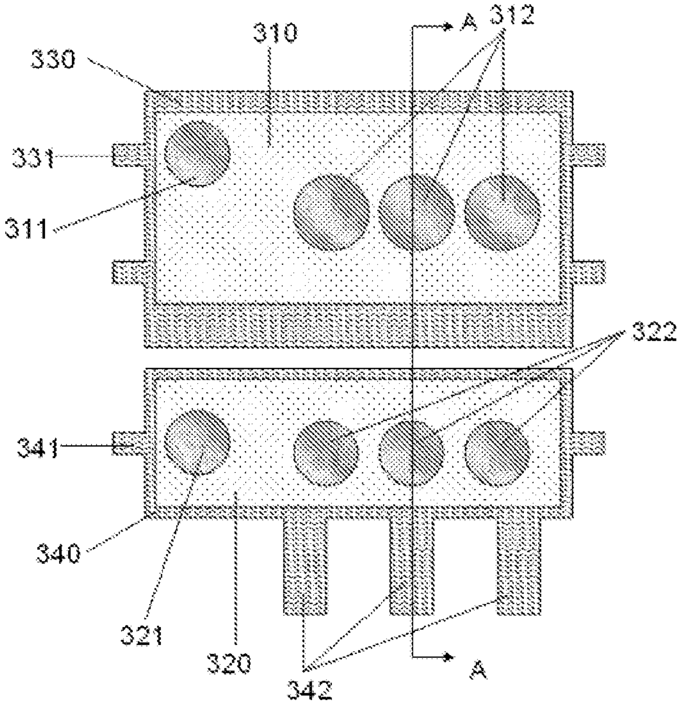
FIG. 15A shows the structure for attaching the chip onto the lead frame in Implementation Example III.
Figure 15B:
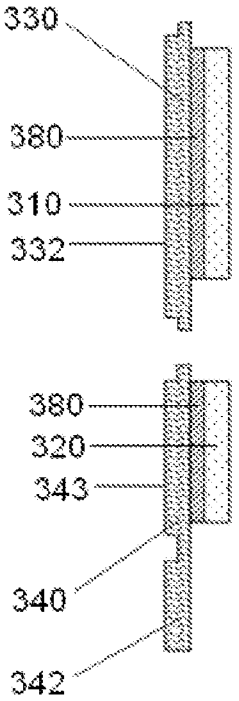
FIG. 15B shows the structure of the cross section along the line A-A in FIG. 15A.
Figure 16A:
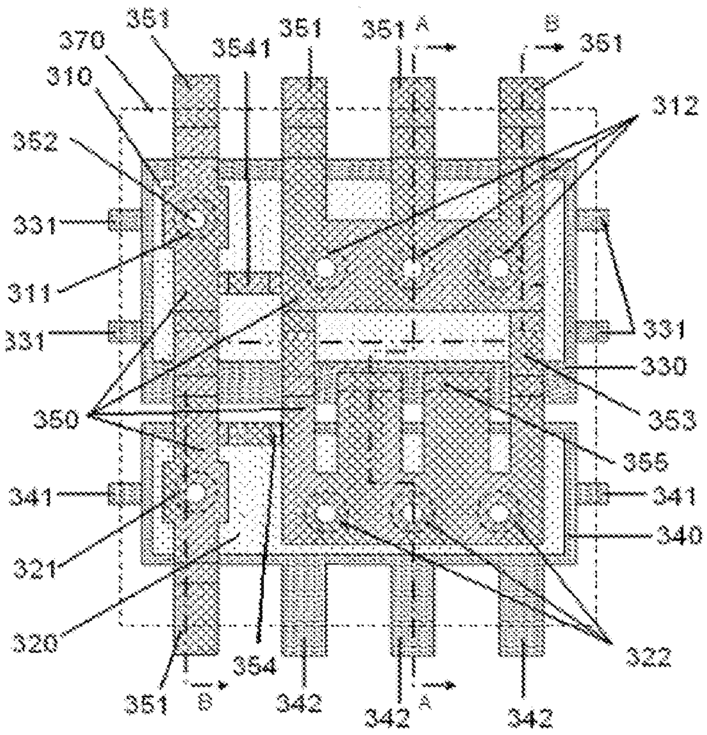
FIG. 16A shows the structure for connecting the top contact zones of two chips with one connecting plate in Implementation Example III.
Figure 16B:
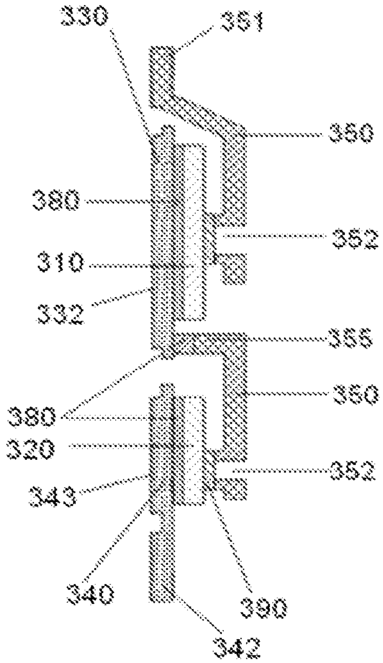
FIG. 16B shows the structure of the cross section along the line A-A in FIG. 16A.
Figure 16C:
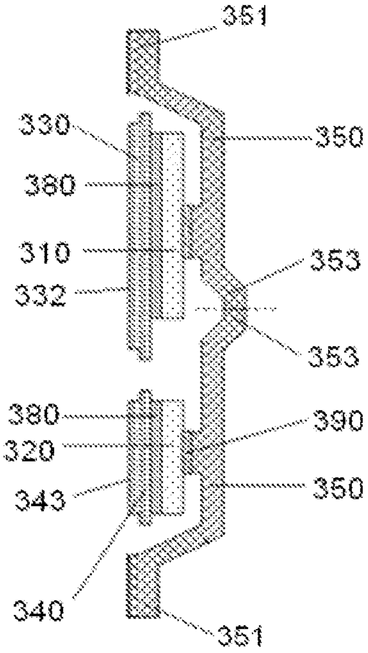
FIG. 16C shows the structure of the cross section along the line B-B in FIG. 16A.
Figure 17A:
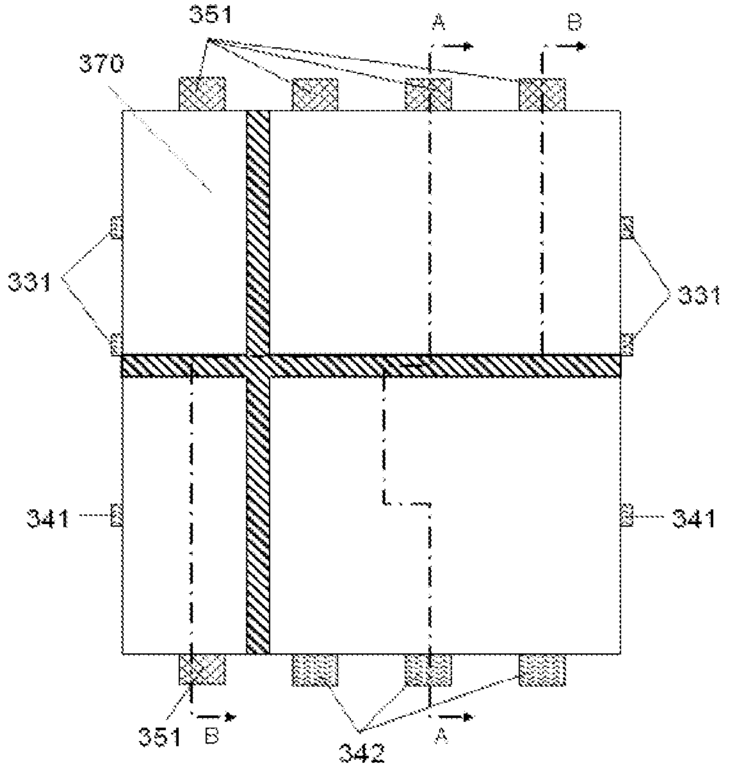
FIG. 17A shows the structure for twice cutting on the top layer of the plastic package in Implementation Example III.
Figure 17B:
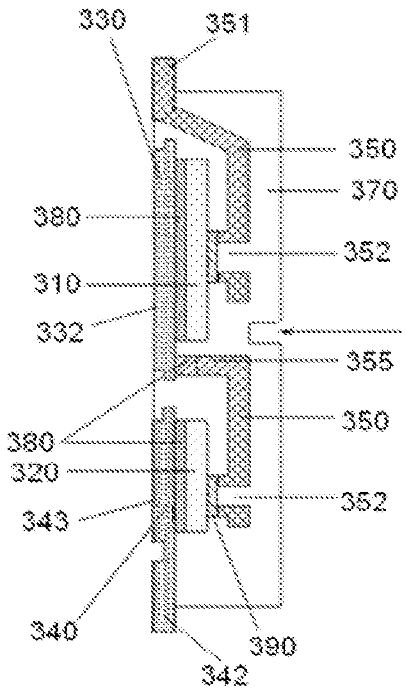
FIG. 17B shows the internal structure of the semiconductor along the line A-A in FIG. 17A.
Figure 17C:
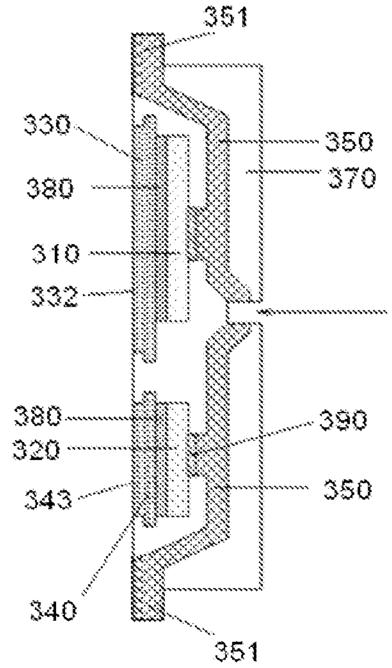
FIG. 17C shows the internal structure of the semiconductor along the line B-B in FIG. 17A.

The procedure of semiconductor packaging method using connecting plate for internal connection, as shown in FIG. 14, includes the following steps: as shown in FIG. 15A and FIG. 15B, firstly provide a lead frame that comprises the lead frame's first die pad 330 and the lead frame's second die pad 340 lead frame tie bars 331 and 341; next, provide two chips, which may be respectively LS MOSFET 310 and HS MOSFET 320. The top contact zones of LS MOSFET 310 may be respectively the gate contact zone 311 and the source contact zone 312, while the bottom contact zone may be drain contact zone (not shown). The top contact zones of HS MOSFET 320 may be respectively the gate contact zone 321 and the source contact zone 322, while the bottom contact zone may be drain contact zone (not shown). LS MOSFET 310 and HS MOSFET 320 may be set on the lead frame's first die pad 330 and the lead frame's second die pad 340 respectively, using the adhesive 380, while the bottom drain contact zones of LS MOSFET 310 and HS MOSFET 320 may be electrically connected with the lead frame's corresponding die pads; next, as shown in FIG. 16A, FIG. 16B and FIG. 16C, provide a connecting plate 350, on which there may be multiple connecting plate tie bar upward regions 353 and 354 for connecting the various portions of the connecting plate 350, arranging the top contact zones of LS MOSFET 310 and HS MOSFET 320 in alignment with each other. The connecting plate 350 connects the gate contact zone 311 of LS MOSFET 310, the gate contact zone 321 of HS MOSFET 320, the source contact zone 312 of LS MOSFET 310 and the source contact zone 322 of HS MOSFET 320 through solder 390. The connecting plate 350 has the connecting plate tie bar upward regions 353 at positions between where the top contact zones of LS MOSFET 310 and that of HS MOSFET 320 may be connected. The connecting plate 350 also has the connecting plate tie bar upward regions 354 at positions between where the top contact zones of LS MOSFET 310 may be connected and between where the top contact zones of HS MOSFET 320 may be connected. The connecting plate tie bar upward regions 353 and 354 may be in vertical direction on the chip surface and higher than the chip surface, as shown in FIG. 16C and are preferably located on a same plan and aligned in one or two lines. Besides, the connecting plate 350 has a downward portion 355 connecting to the first die pad 330 for connection of the top source contact zone of HS MOSFET 320 and the bottom drain contact zone of LS MOSFET 310, therefore the position of LS MOSFET 310 and HS MOSFET 320 is secured by the connecting plate 350. The connecting plate 350 has the column 352 at the position in contact with the chip top, provide a plastic molding material 370 to fill up the column 352 and substantially encapsulate the lead frame, chips and various portions of the connecting plate except the end portions 351; finally, as shown in FIG. 17A, FIG. 17B and FIG. 17C, on the top layer of the plastic package 370, carry out shallow cutting twice downward in alignment with the multiple connecting plate tie bar upward regions 353 and connecting plate tie bar upward regions 354, shown as shade areas in FIG. 17A, since the multiple connecting plate tie bar upward regions 353 and 354 may be respectively set on a straight line. Carry out cutting in the direction indicated by the arrows in FIGS. 17B and 17C to cut off sections of the multiple connecting plate tie bar upward regions 353 and 354 of the connecting plate 350, dividing the connecting plate 350 into four connecting plate portions insulated against each other. In this packaging process, one or more chips may be fixed and connected using a connecting plate, and the connecting plate may be divided into various portions by shallow cutting after plastic packaging, thus ensuring a more secure position of the chips and preventing dislocation between the chips and the lead frames and the connecting plates. The cutting process will leave trenches on top of the package. Alternatively a dielectric material such as the molding compound can be used to refill the trenches.

Figure 18A:
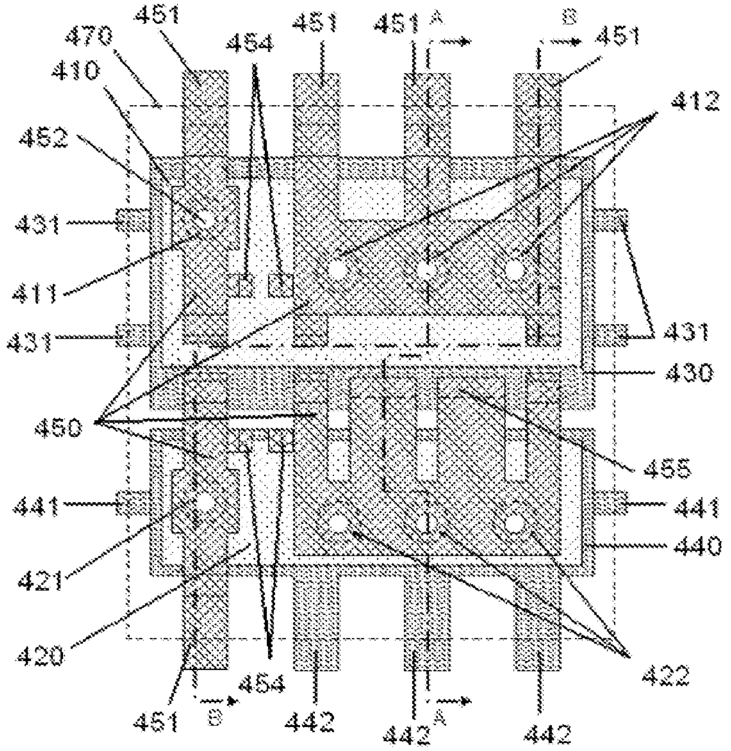
FIG. 18A shows the structure of the semiconductor package in Implementation Example IV, wherein two chips may be fixed and connected using one connecting plate and the connecting plate is separated after grinding on the top layer.
Figure 18B:
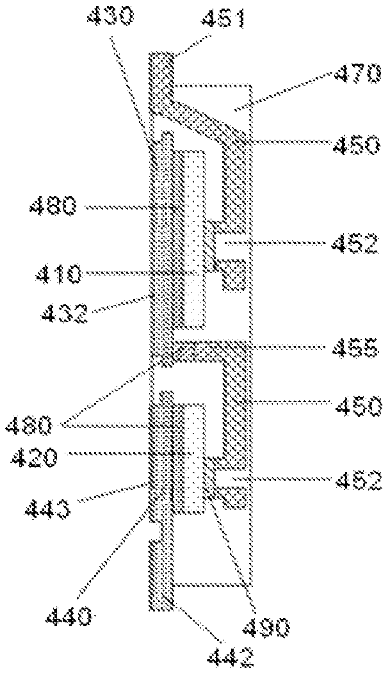
FIG. 18B shows the structure of the cross section along the line A-A in FIG. 18A.
Figure 18C:
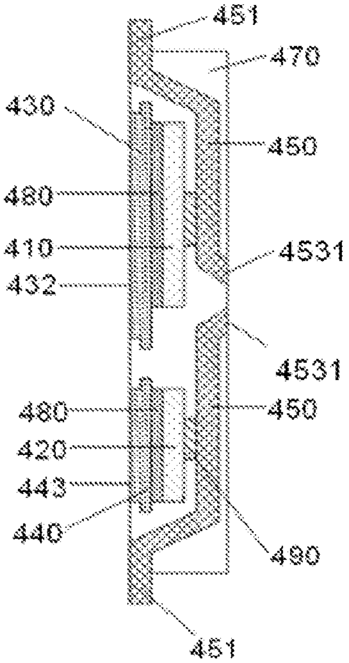
FIG. 18C shows the structure of the cross section along the line B-B in FIG. 18A.

IMPLEMENTATION EXAMPLE IV the semiconductor package using connecting plate for internal connection, as shown in FIG. 18A, FIG. 18B and FIG. 18C, comprises two chips, a lead frame, a connecting plate and a plastic package 470 encapsulating all the above components; the two chips may be respectively low-side metal-oxide-semiconductor field-effect transistor (LS MOSFET) 410 and high-side metal-oxide-semiconductor field-effect transistor (HS MOSFET) 420. The top contact zones of LS MOSFET 410 may be respectively the gate contact zone 411 and the source contact zone 412, while the bottom contact zone may be drain contact zone (not shown). The top contact zones of HS MOSFET 420 may be respectively the gate contact zone 421 and the source contact zone 422, while the bottom contact zone may be drain contact zone (not shown). The lead frame includes the first die pad 430 and the second die pad 440, onto which LS MOSFET 410 and HS MOSFET 420 may be respectively set through the adhesive 480. The bottom drain contact zones of LS MOSFET 410 and HS MOSFET 420 may be electrically connected with each die pad of the lead frame. An exposed bottom 432 serves as the drain contact electrode for connecting LS MOSFET 410 with the external circuit and facilitate heat dissipation of the power semiconductor, while the lead frame's connecting bar 431 is used for connection among the various units of the lead frame (only one unit shown). On the lead frame's second die pad 440, there may be a plurality of tie bars 441, and pins 442 connecting to the die pad 440 with an exposed bottom 443, in which the lead frame's pins 442 are used for connection between the package and the external circuit. Multiple connecting plate portions may be divided from a connecting plate 450, on which there may be multiple connecting plate tie bar upward regions 453 and 454 for connecting the various portions of the connecting plate. Sections of conductive tie bar upward regions 453 and 454 are removed to provide electrical isolation between various portions of the connecting plate 450 each connects the gate contact zone 411 of LS MOSFET 410 and the gate contact zone 421 of HS MOSFET 420, as well as the source contact zone 412 of LS MOSFET 410 and the source contact zone 422 of HS MOSFET 420 through solder 490, thus fixing the position of LS MOSFET 410 and HS MOSFET 420. On the connecting plate 450, there are hollow cylindrical columns 452 at positions corresponding to the gate contact zones 411 and 421 as well as the source contact zones 412 and 422 of LS MOSFET 410 and HS MOSFET 420. End portions 451 of the connecting plate 450 extending outside a molding plastic package 470 are used as the package pin to connect with the external circuit, as shown in FIG. 18B. FIG. 18B shows the cross section along the line A-A in FIG. 18A. Since the line A-A just runs through the column 452, FIG. 18B shows the column 452 very clearly. When the plastic molding material 470 is used for encapsulation, the column 452 will be filled up, thus enabling the plastic package to encapsulate the various components inside the package more steadily. As shown in FIG. 18C, end cross sections 4531 of the discontinue portions of the connecting plate 450 expose and flush with the top of the plastic package 470. Besides, the connecting plate 450 has a downward portion 455 connecting to the first die pad 430 for connection of the top source contact zone of HS MOSFET 420 and the bottom drain contact zone of LS MOSFET 410, thus connecting HS MOSFET 420 and LS MOSFET 410.

Figure 21A:
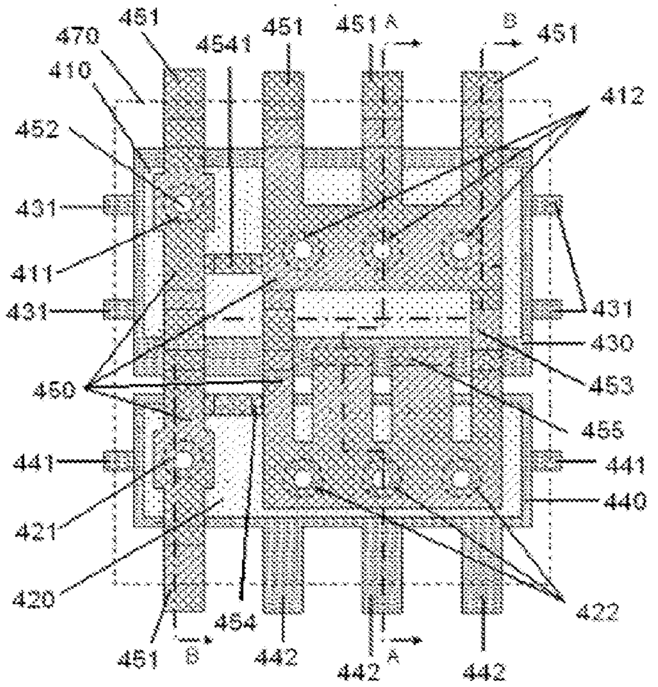
FIG. 21A shows the structure for connecting the top contact zones of two chips with one connecting plate in Implementation Example IV.
Figure 21B:
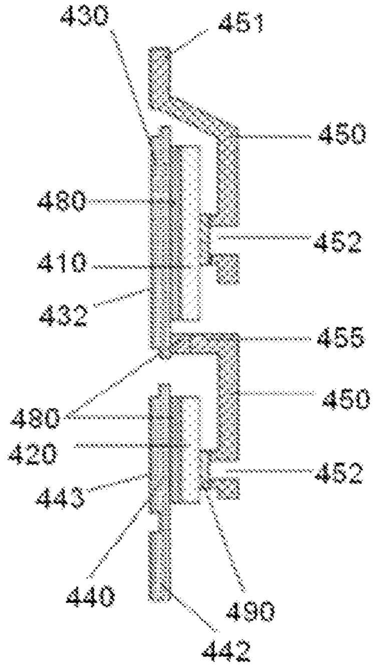
FIG. 21B shows the structure of the cross section along the line A-A in FIG. 21A.
Figure 21C:
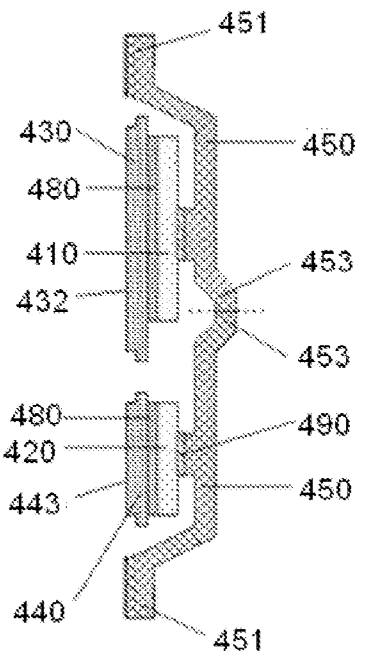
FIG. 21C shows the structure of the cross section along the line B-B in FIG. 21A.
Figure 22:
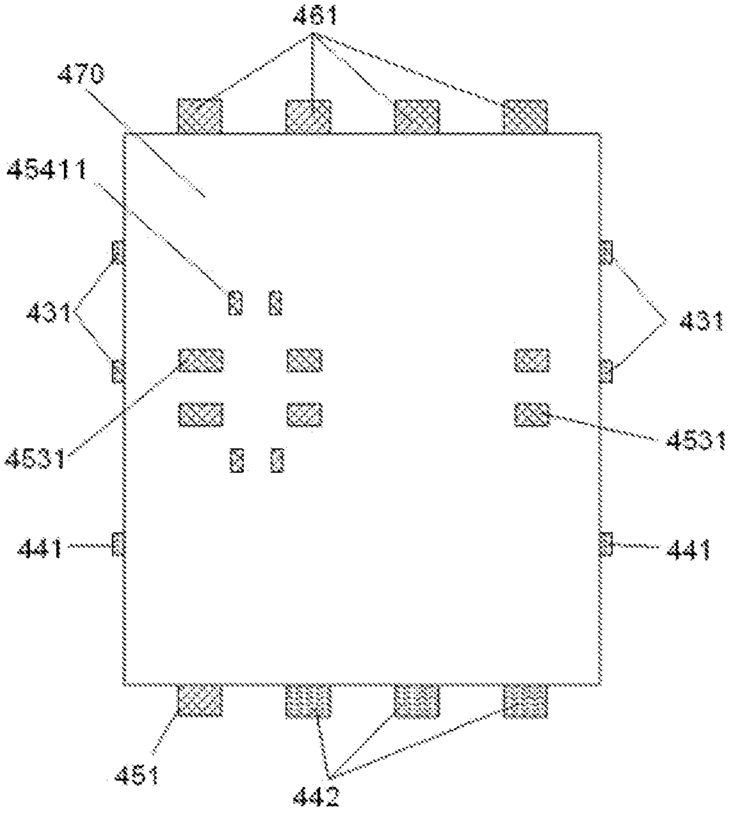
FIG. 22 shows the structure for grinding on the top layer of the plastic package in Implementation Example IV.

The procedure of semiconductor packaging method using connecting plate for internal connection, as shown in FIG. 19, includes the following steps: as shown in FIG. 20A and FIG. 20B, firstly provide a lead frame that comprises the lead frame's first die pad 430 and the lead frame's second die pad 440 with lead frame tie bars 431 and 441; next, provide two chips, which may be respectively LS MOSFET 410 and HS MOSFET 420. The top contact zones of LS MOSFET 410 may be respectively the gate contact zone 411 and the source contact zone 412, while the bottom contact zone may be drain contact zone (not shown). The top contact zones of HS MOSFET 420 may be respectively the gate contact zone 421 and the source contact zone 422, while the bottom contact zone may be drain contact zone (not shown). LS MOSFET 410 and HS MOSFET 420 may be set on the lead frame's first die pad 430 and the lead frame's second die pad 440 respectively, using the adhesive 480, while the bottom drain contact zones of LS MOSFET 410 and HS MOSFET 420 may be electrically connected with the lead frame's corresponding die pads; next, as shown in FIG. 21A, FIG. 21B and FIG. 21C, provide a connecting plate 450, on which there may be multiple connecting plate tie bar upward regions 453 and 454 for connecting the various portions of the connecting plate 450, arranging the top contact zones of LS MOSFET 410 and HS MOSFET 420 in alignment with each other. Each portion of the connecting plate 450 respectively connects the gate contact zone 411 of LS MOSFET 410, the gate contact zone 421 of HS MOSFET 420, the source contact zone 412 of LS MOSFET 410 and the source contact zone 422 of HS MOSFET 420 through solder 490. The connecting plate 450 has the connecting plate tie bar upward regions 453 at positions between where the top contact zones of LS MOSFET 410 and that of HS MOSFET 420 may be connected. The connecting plate 450 also has the connecting plate tie bar upward regions 454 at positions between where the top contact zones of LS MOSFET 410 may be connected and between where the top contact zones of HS MOSFET 420 may be connected. The connecting plate tie bar upward regions 453 and 454 may be in vertical direction above the chip surface and higher than the chip surface, as shown in FIG. 22C and are preferably located on a same plan. Besides, the connecting plate 450 has a downward portion 455 connecting to the first die pad 430 for connection of the top source contact zone of HS MOSFET 420 and the bottom drain contact zone of LS MOSFET 410, therefore the position of LS MOSFET 410 and HS MOSFET 420 is secured by the connecting plate 450. The connecting plate 450 has the columns 452 at the positions in contact with the chips; then, as shown in FIG. 22, provide a plastic molding material 470 to fill up the columns 452 and substantially encapsulate the lead frame, chips and connecting plates except the end portions 451; finally, grind the top layer of the plastic package 470 to remove the top portion of the molding material and portions of the tie bar upward regions 453 and 454 to the extend that the a conductive section of each of the tie bar upward regions is removed such that various connecting plate portions of connecting plate 450 are completely disconnected with each other with the cross sections 4531 of the discontinue connecting plate tie bar upward regions 453 exposed and separated, thus dividing the connecting plate 450 into four connecting plate portions insulated against each other. In this packaging process, one or more chips may be fixed and connected using the integrated connecting plate 450, and the connecting plates may be divided by grinding the top layer of the plastic package after plastic molding, thus ensuring a more secure position of the chips and preventing dislocation between the chips and the lead frames and the connecting plates. Alternatively, an optional dielectric layer such as a layer of molding compound may be disposed at the top surface to cover up the exposed connecting plate sections.

The above implementation examples describe the fixation and connection of two chips using the integrated connecting plate, separation of the connecting plate by shallow cutting on the top layer of the plastic package after packaging, or separation of the connecting plate by grinding on the top layer of the plastic package after packaging; they also describe the packaging structure and method using one or more connecting plates to fix and connect two chips. In actual application, multiple chips can be fixed and connected through one or multiple connecting plates. Such chips may be not limited to the combination of high side and low side MOSFET chips, but also apply to other combinations of semiconductor chips. Depending on the design of semiconductor chips and the intended circuit connection, multiple chips may be mounted on a single die pad or different die pads of a lead frame. This packaging method maintains the spacing between various connecting plate portions and prevents plate drifting during the manufacturing process, thus provides an improved package method for multiple chips plate connection package.

The invention claimed is:

1. A semiconductor package comprising:

A plurality of semiconductor chips each having a plurality of electrode contact areas disposed on a top surface;

A first connecting plate comprising a plurality of connecting plate tie bar upward regions separating the connecting plate into a plurality of connecting plate portions;

whereas each of the plurality of connecting plate portions electrically connecting to a contact area of the plurality of electrode contact areas;

whereas a conductive section of each of the plurality of connecting plate tie bar upward regions is removed such that each of the plurality of connecting plate portions is electrically isolated from the others.

2. The semiconductor package of claim 1 wherein the first connecting plate comprising a first connecting plate portion and a second connecting plate portion separated by one or more tie bar upward regions, the first connecting plate portion electrically connects to a first electrode contact area on a first semiconductor chip and the second connecting plate portion electrically connects to a second electrode contact area on the first semiconductor chip.

3. The semiconductor package of claim 2 further comprising:

A molding material encapsulating the first semiconductor chip and the first and second connecting plate portions having a top surface with a shallow trench cutting through sections of the plurality of tie bar upward regions electrically isolating the first and second connecting plate portions.

4. The semiconductor package of claim 2 further comprising:

A molding material encapsulating the first semiconductor chip and the first and second connecting plate portions having a top surface with end cross sections of remaining tie bar upward regions exposed and flushed with the top surface of the molding material.

5. The semiconductor package of claim 1 wherein the first connecting plate comprising a first connecting plate portion and a second connecting plate portion separated by one or more tie bar upward regions, the first connecting plate portion electrically connects to a first electrode contact area on a first semiconductor chip and the second connecting plate portion electrically connects to a first electrode contact area on a second semiconductor chip different from the first semiconductor chip.

6. The semiconductor package of claim 5 further comprising:

A molding material encapsulating the first semiconductor chip and the first and second connecting plate portions having a top surface with a shallow trench cutting through a portion of the tie bar upward region electrically isolating the first and second connecting plate portions.

7. The semiconductor package of claim 5 further comprising:

A molding material encapsulating the first semiconductor chip and the first and second connecting plate portions having a top surface with end cross sections of remaining tie bar upward regions exposed and flushed with the top surface of the molding material.

8. The semiconductor package of claim 1 wherein the lead frame further comprising a first die pad having a first semiconductor chip mounted thereon and a second die pad having a second semiconductor chip mounted thereon.

9. The semiconductor package of claim 8 wherein the connecting plate further comprising a downward portion connecting to the first die pad.

10. The semiconductor package of claim 1 wherein the plurality of semiconductor chips comprise a first MOSFET chip serving as a high side (HS) MOSFET and a second MOSFET chip serving as a low side (LS) MOSFET.

11. The semiconductor package of claim 10 wherein the HS MOSFET comprising a first and a second electrode contact areas disposed on a top surface of the HS MOSFET chip; whereas the LS MOSFET comprising a first and a second electrode contact areas disposed on a top surface of the LS MOSFET chip.

12. The semiconductor package of claim 11 wherein the first connecting plate comprising a first connecting plate portion and a second connecting plate portion separated by a plurality of tie bar upward regions; whereas the first connecting plate portion electrically connects to a first electrode contact area of the HS MOSFET chip and the second connecting plate portion electrically connects to the first electrode contact area on the LS MOSFET chip.

13. The semiconductor package of claim 12 wherein the HS MOSFET chip further comprising a bottom electrode disposed at a bottom surface of the HS MOSFET chip and the LS MOSFET chip further comprising a bottom electrode disposed at a bottom surface of the LS MOSFET chip.

14. The semiconductor package of claim 12 wherein the first connecting plate further comprising a downward portion connecting to the first die pad for electrically connecting an electrode on the HS MOSFET top surface to the bottom electrode of the LS MOSFET.

15. The semiconductor package of claim 14 further comprising a second connecting plate comprising a tie bar upward region separating the connecting plate into a first portion and a second portion, the first connecting plate portion electrically connecting to the second electrode contact area on the HS MOSFET and the second connecting plate portion electrically connecting to the second electrode contact area on the LS MOSFET.

16. The semiconductor package of claim 15 wherein a conductive section of the second connecting plate tie bar upward regions is removed such that the first connecting plate portion is electrically isolated from the second connecting plate portion.

17. The semiconductor package of claim 1 wherein end portions of the first connecting plate extending outside the molding compound package for electrically connecting to external circuit.

18. The semiconductor package of claim 1 wherein the plurality of tie bar upward regions are located substantially on a same plan.

19. The semiconductor package of claim 1 wherein the plurality of tie bar upward regions are substantially aligned in one or two lines.

* * * * *